United States Patent
Nakamura et al.

(10) Patent No.: US 10,545,395 B2
(45) Date of Patent: Jan. 28, 2020

(54) ILLUMINATION OPTICAL SYSTEM, EXPOSURE APPARATUS, AND METHOD OF MANUFACTURING ARTICLE

(71) Applicant: CANON KABUSHIKI KAISHA, Tokyo (JP)

(72) Inventors: Yuji Nakamura, Utsunomiya (JP); Daisuke Kobayashi, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/123,389

(22) Filed: Sep. 6, 2018

(65) Prior Publication Data

US 2019/0079377 A1    Mar. 14, 2019

(30) Foreign Application Priority Data

Sep. 11, 2017  (JP) .................. 2017-174244

(51) Int. Cl.
*G03F 7/20* (2006.01)
*G03B 21/20* (2006.01)
*G02B 27/09* (2006.01)

(52) U.S. Cl.
CPC ..... *G03B 21/2033* (2013.01); *G02B 27/0916* (2013.01); *G02B 27/0955* (2013.01); *G03F 7/70075* (2013.01); *G03F 7/70191* (2013.01)

(58) Field of Classification Search
CPC ............ G02B 27/0916; G02B 27/0955; G03B 21/2033; G03F 7/70025; G03F 7/70075;
(Continued)

(56) References Cited

U.S. PATENT DOCUMENTS 3,157,087 A * 11/1964 Kallenberg .......... G03B 27/545
                                                            353/102
3,476,463 A    11/1969 Kreuzer
(Continued)

FOREIGN PATENT DOCUMENTS

JP    S63032555 A    2/1988
JP    H10153750 A    6/1998
(Continued)

OTHER PUBLICATIONS

Office Action issued in Japanese Appln. No. 2017-174244 dated Mar. 1, 2019. English Translation provided.
(Continued)

*Primary Examiner* — Colin W Kreutzer
(74) *Attorney, Agent, or Firm* — Rossi, Kimms & McDowell LLP

(57) ABSTRACT

The present invention provides an illumination optical system that illuminates a surface to be illuminated by using a light beam from a light source, comprising: an optical element configured to transmit the light beam from the light source; and a member that has an incident surface on which the light beam transmitted through the optical element is incident, wherein the optical element has a first region including a central portion of the optical element, and a second region outside the first region, and wherein the optical element is formed so as to overlap a part of a light beam which is transmitted through the first region and a part of the light beam which is transmitted through the second region, on the incident surface.

18 Claims, 7 Drawing Sheets

(58) Field of Classification Search
CPC ............. G03F 7/70091; G03F 7/70108; G03F 7/70158; G03F 7/70191; G03F 7/7055
USPC .................. 355/67, 71, 77; 359/707, 710
See application file for complete search history.

(56) References Cited

U.S. PATENT DOCUMENTS

| | | | |
|---|---|---|---|
| 4,682,885 A * | 7/1987 | Torigoe | G03F 7/70058 355/67 |
| 7,005,605 B2 | 2/2006 | Ichihashi et al. | |
| 7,379,160 B2 | 5/2008 | Toyoda | |
| 9,690,105 B2 | 6/2017 | Kirshner et al. | |
| 2001/0055107 A1* | 12/2001 | Tsuji | G03B 27/54 355/67 |
| 2012/0206924 A1 | 8/2012 | Ito et al. | |
| 2013/0148092 A1 | 6/2013 | Wangler et al. | |

FOREIGN PATENT DOCUMENTS

| | | |
|---|---|---|
| JP | 2001284212 A | 10/2001 |
| JP | 2003112280 A | 4/2003 |
| JP | 2003279884 A | 10/2003 |
| JP | 2003344762 A | 12/2003 |
| JP | 2004045885 A | 2/2004 |
| JP | 2004172440 A | 6/2004 |
| JP | 3684927 B2 | 8/2005 |
| JP | 2006203257 A | 8/2006 |
| JP | 2006215131 A | 8/2006 |
| JP | 2009134316 A | 6/2009 |
| JP | 2012168328 A | 9/2012 |
| JP | 2014186292 A | 10/2014 |
| TW | 200949416 A | 12/2009 |

OTHER PUBLICATIONS

Office Action issued in Japanese Appln. No. 2017-174244 dated Jun. 18, 2019.
Office Action issued in Taiwanese Application No. 107129381 dated Sep. 26, 2019. English translation provided.

* cited by examiner

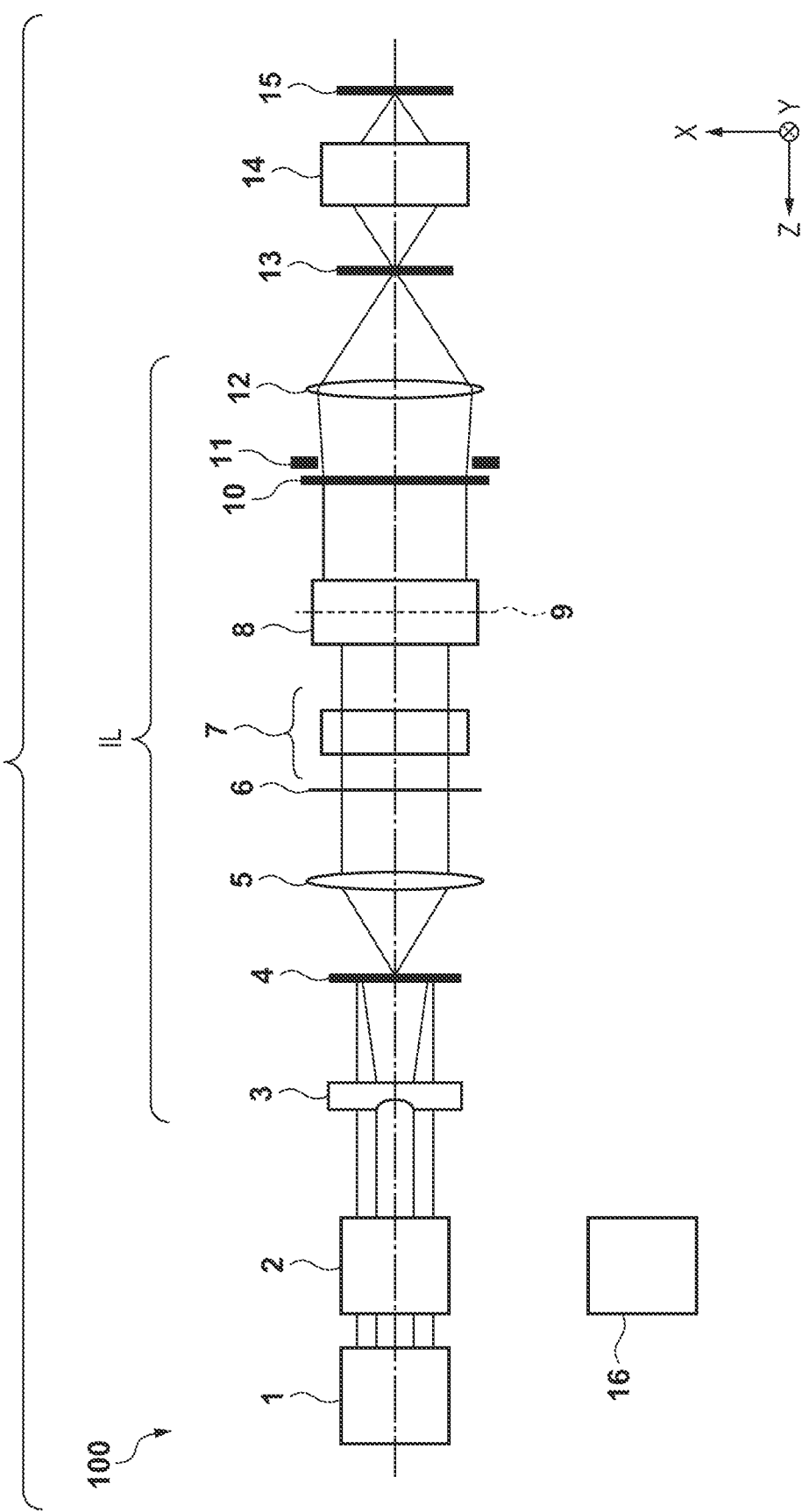

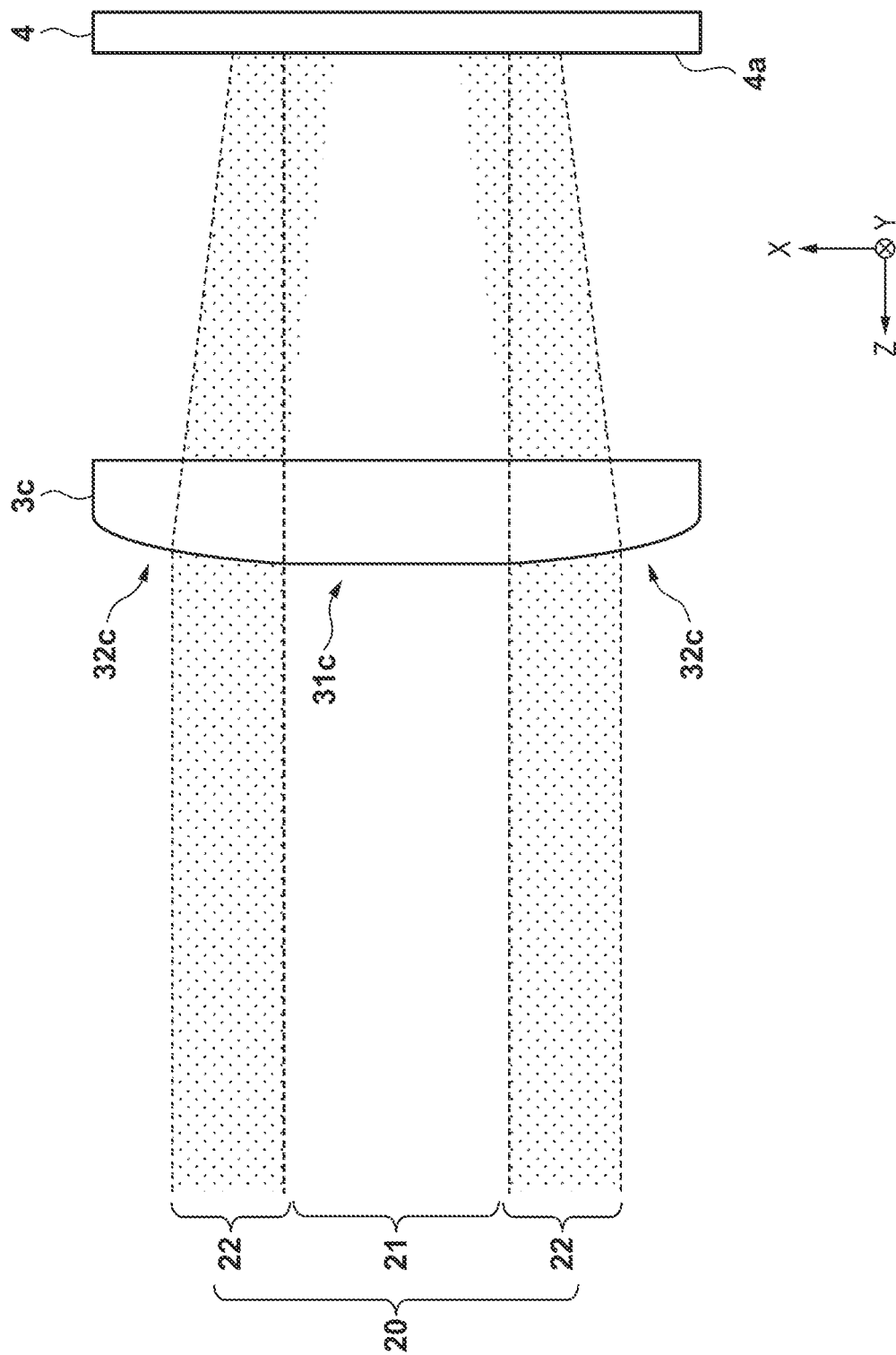

ILLUMINATION OPTICAL SYSTEM, EXPOSURE APPARATUS, AND METHOD OF MANUFACTURING ARTICLE

BACKGROUND OF THE INVENTION

Field of the Invention

The present invention relates to an illumination optical system, an exposure apparatus, and a method of manufacturing an article.

Description of the Related Art

Along with the advancement in miniaturization and integration of circuit patterns in semiconductor circuits, an exposure apparatus that uses, as a light source, an excimer laser such as a KrF laser (248 nm) or an ArF laser (193 nm) which emits a short-wavelength laser beam has gained attention. In order to improve the throughput of the exposure apparatus, the output of the light source is being increased.

When an excimer laser or the like is to be used as a light source, it is known that light intensity distribution in which the light intensity near the center is higher than the light intensity in the peripheral portion will be generated in a light beam emitted from the light source. Hence, in an optical member, such as an illumination optical system or the like, which is irradiated by a light beam from a light source, the optical energy is concentrated locally, and this can facilitate the degradation of the glass material performance of the optical member. Instead of the generally used quartz glass, Japanese Patent-Laid Open No. 2004-172440 proposes to adopt, as the glass material of the optical member, fluorite whose glass material performance is less likely to degrade due to irradiation of light.

However, since the cost of fluorite is comparatively higher than the cost of quartz glass, adopting fluorite as the glass material for the optical member can increase the cost of the overall exposure apparatus. Therefore, there is desired an exposure apparatus that has an arrangement in which the degradation of the glass material performance can be reduced (delayed) even if quartz glass is used as the Mass material of the optical member.

SUMMARY OF THE INVENTION

The present invention provides a technique advantageous in, for example, reducing the degradation of glass material performance of an optical member which is irradiated with a light beam from a light source.

According to one aspect of the present invention, there is provided an illumination optical system that illuminates a surface to be illuminated by using a light beam from a light source, comprising: an optical element configured to transmit the light beam from the light source; and a member that has an incident surface on which the light beam transmitted through the optical element is incident, wherein the optical element has a first region including a central portion of the optical element, and a second region outside the first region, and wherein the optical element is formed so as to overlap a part of a light beam which is transmitted through the first region and a part of the light beam which is transmitted through the second region, on the incident surface.

Further features of the present invention will become apparent from the following description of exemplary embodiments with reference to the attached drawings.

BRIEF DESCRIPTION OF THE DRAWINGS

FIG. 1 is a schematic view showing the arrangement of an exposure apparatus;

FIG. 8 is a view showing an optical path until the light beam from the light source is incident on the diffraction optical element via the optical lens.

DESCRIPTION OF THE EMBODIMENTS

Figure 2A:
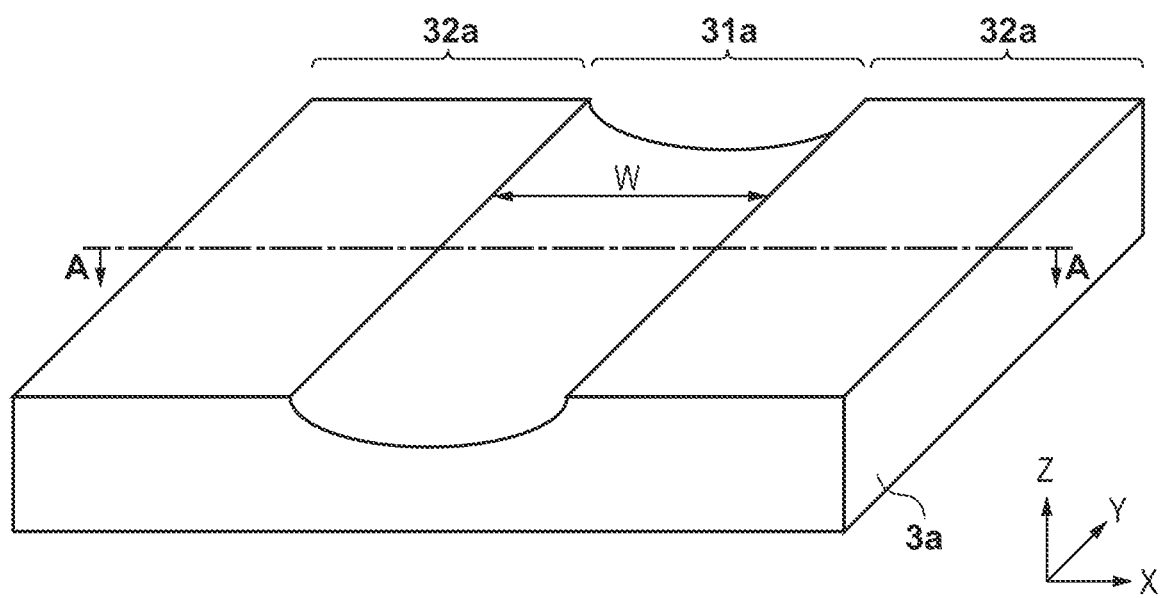
FIG. 2A is a view showing the arrangement of an optical lens according to Example 1.

Exemplary embodiments of the present invention will be described below with reference to the accompanying drawings. Note that the same reference numerals denote the same members throughout the drawings, and a repetitive description thereof will not be given.

First Embodiment

An exposure apparatus 100 according to the first embodiment of the present invention will be described. FIG. 1 is a schematic view showing the arrangement of the exposure apparatus 100 according to the first embodiment. The exposure apparatus 100 includes a light source 1, a relay optical system 2, an illumination optical system IL that uses a light beam from the light source 1 to illuminate an original 13 such as a mask or a reticle, a projection optical system 14 that projects the pattern of the original 13 to a substrate 15 such as a wafer or a liquid crystal substrate, and a control unit 16. The control unit 16 includes, for example, a CPU and a memory and controls each unit of the exposure apparatus 100 (controls substrate exposure processing). Although a step-and-scan exposure apparatus will be exemplified in this embodiment, the present invention is also applicable to a step-and-repeat exposure apparatus.

The light source 1 includes a laser light source such as an excimer laser and emits a light beam (light). The relay optical system 2 is arranged between the light source 1 and the illumination optical system IL (an optical lens 3) and guides the light beam emitted from the light source 1 to the illumination optical system IL.

The illumination optical system IL can include the optical lens (optical element) 3, a diffraction optical element (member) 4, a condenser lens 5, a prism unit 7, and a zoom lens unit 8. The illumination optical system IL can further include a multi beam generating unit 10, an aperture stop 11, and a condenser lens 12. In this embodiment, for example, quartz glass can be adopted as the glass material of an optical member (for example, the diffraction optical element 4) forming the illumination optical system IL.

The optical lens 3 is arranged between the relay optical system 2 and the diffraction optical element 4 and guides the light beam from the light source 1 (relay optical system 2) to the diffraction optical element 4 by changing the shape of the light intensity distribution (in a direction of a plane perpendicular to the optical axis) of the light beam. More specifically, the optical lens 3 uniformizes the light intensity distribution of the light beam from the light source 1 and guides the light beam to the diffraction optical element 4. A detailed arrangement of the optical lens 3 will be described later.

The diffraction optical element 4 is arranged between the optical lens 3 and the condenser lens 5, includes a surface (to be also referred to as an incident surface 4a hereinafter) that the light beam transmitted through the optical lens 3 is incident on, and diffracts the light beam to guide the light beam to the condenser lens 5. The diffraction optical element 4 can be arranged on a plane conjugate to the original 13 which is the surface to be illuminated or a plane in a Fourier transform relationship with the pupil plane of the illumination optical system IL. The diffraction optical element 4 forms a desired light intensity by transforming, by a diffraction effect, the light intensity distribution of the light beam from the light source 1 on the pupil plane of the illumination optical system IL which is a plane conjugate to the pupil plane of the projection optical system 14 or on the plane conjugate to the pupil plane of the illumination optical system IL. The diffraction optical element 4 may use a computer generated hologram designed by a computer so that a desired diffraction pattern can be obtained on the diffraction pattern surface. The shape of the light source formed on the pupil plane of the projection optical system 14 is called an effective light source shape.

A plurality of diffraction optical elements 4 can be arranged in the illumination optical system IL, and each diffraction optical element 4 is attached and mounted to a corresponding one of a plurality of slots on a turret (not shown). The plurality of diffraction optical elements 4 can form different effective light source shapes, respectively. These effective light source shapes include a small circular shape (comparatively small circular shape), a large circular shape (comparatively large circular shape), an annular shape, a dipole, a quadrupole, and the like. The method of performing illumination by using an effective light source shape such as the annular shape, the dipole, or the quadrupole is called modified illumination.

The condenser lens 5 is arranged between the diffraction optical element 4 and the prism unit 7, condenses the light beam diffracted by the diffraction optical element 4, and forms a diffraction pattern on a Fourier transform plane 6.

The prism unit 7 and the zoom lens unit 8 are arranged between the condenser lens 5 and the multi beam generating unit (optical integrator) 10 and function as a zoom optical system that expands the light intensity distribution formed on the Fourier transform plane 6. The prism unit 7 can adjust the annular ratio or the like of the diffraction pattern (light intensity distribution) formed on the Fourier transform plane 6 and can guide the pattern to the zoom lens unit 8.

In addition, the zoom lens unit 8 is arranged between the prism unit 7 and the multi beam generating unit 10. The zoom lens unit 8 can guide, to the multi beam generating unit 10, the diffraction pattern formed on the Fourier transform plane 6 by adjusting the σ value of the diffraction pattern based on the ratio between the NA of the illumination optical system IL and the NA of the projection optical system 14.

The multi beam generating unit 10 is arranged between the zoom lens unit 8 and the condenser lens 12 and can include a fly-eye lens that forms a plurality of secondary light sources in accordance with the diffraction pattern whose annular ratio, aperture angle, and σ value have been adjusted and guides the plurality of secondary light sources to the condenser lens 12. However, the multi beam generating unit 10 may include another optical integrator such as an optical pipe, a diffraction optical element, a microlens array, or the like. The aperture stop 11 is arranged between the multi beam generating unit 10 and the condenser lens 12.

The condenser lens 12 is arranged between the multi beam generating unit 10 and the original 13. The condenser lens 12 condenses the plurality of light beams guided from the multi beam generating unit 10 and illuminates the original 13 with the condensed plurality of lights in a superimposed manner. The original 13 can be uniformly illuminated by using the illumination optical system IL formed in this manner.

The original 13 is arranged between the condenser lens 12 and the projection optical system 14 and has a circuit pattern that is to be transferred onto a substrate. The original 13 is held and driven by an original stage (not shown). The projection optical system 14 is arranged between the original 13 and the substrate 15 and maintains the optically conjugate relationship between the original 13 and the substrate 15. The substrate 15 is held and driven by a substrate stage (not shown).

In the exposure apparatus 100 which uses an excimer laser or the like as the light source 1 in this manner, it is known that light intensity distribution in which the light intensity near the center is higher than the light intensity in the peripheral portion is generated in a light beam emitted from the light source 1. Hence, in an optical member (for example, the diffraction optical element 4) of the illumination optical system IL which is irradiated by the light beam from the light source 1, the optical energy becomes locally concentrated, and this can facilitate the degradation of the glass material performance of the optical member.

Therefore, in the exposure apparatus 100 (illumination optical system IL) according to this embodiment, the optical lens 3 which uniformizes the light intensity distribution of the light beam emitted from the light source 1 is arranged between the light source 1 (relay optical system 2) and the diffraction optical element 4. The optical lens 3 includes a first region which includes the central portion of the optical lens 3 and a second region on the outer side the first region. A light beam (first light beam) near the center of the light beam from the light source 1 is transmitted through the first region. A light beam (second light beam) in the peripheral portion on the outer side of the first light beam is transmitted through the second region. The optical lens 3 has different curvatures for the first region and the second region so that a part of the first light beam transmitted through the first region and a part of the second light beam transmitted through the second region will overlap each other on the incident surface 4a of the diffraction optical element 4. The detailed arrangement of the optical lens 3 will be described hereinafter. The optical lens 3 can be designed in accordance with the specification (may be a measured value) of the light intensity distribution of the light beam from the light source 1.

Example 1

In the light source 1 using an excimer laser or the like, light intensity distribution may be generated, in the light beam emitted from the light source 1, in at least one (the X direction in FIG. 1) of the planar directions perpendicular to the optical axis. Example 1 will describe the arrangement of the optical lens 3 in a case in which the light intensity distribution has been generated in the one direction of the light beam from the light source 1.

Figure 2B:
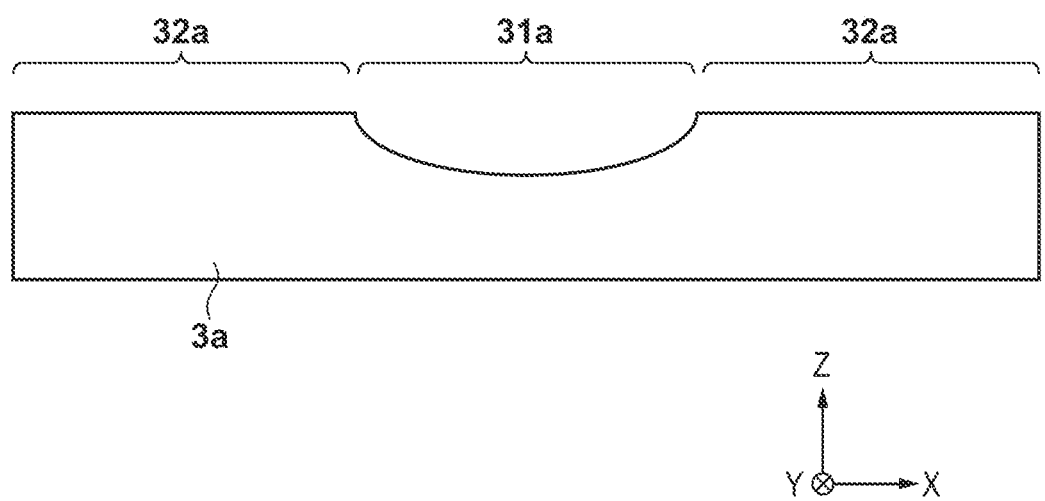
FIG. 2B is a view showing the arrangement of the optical lens of Example 1.
Figure 3:
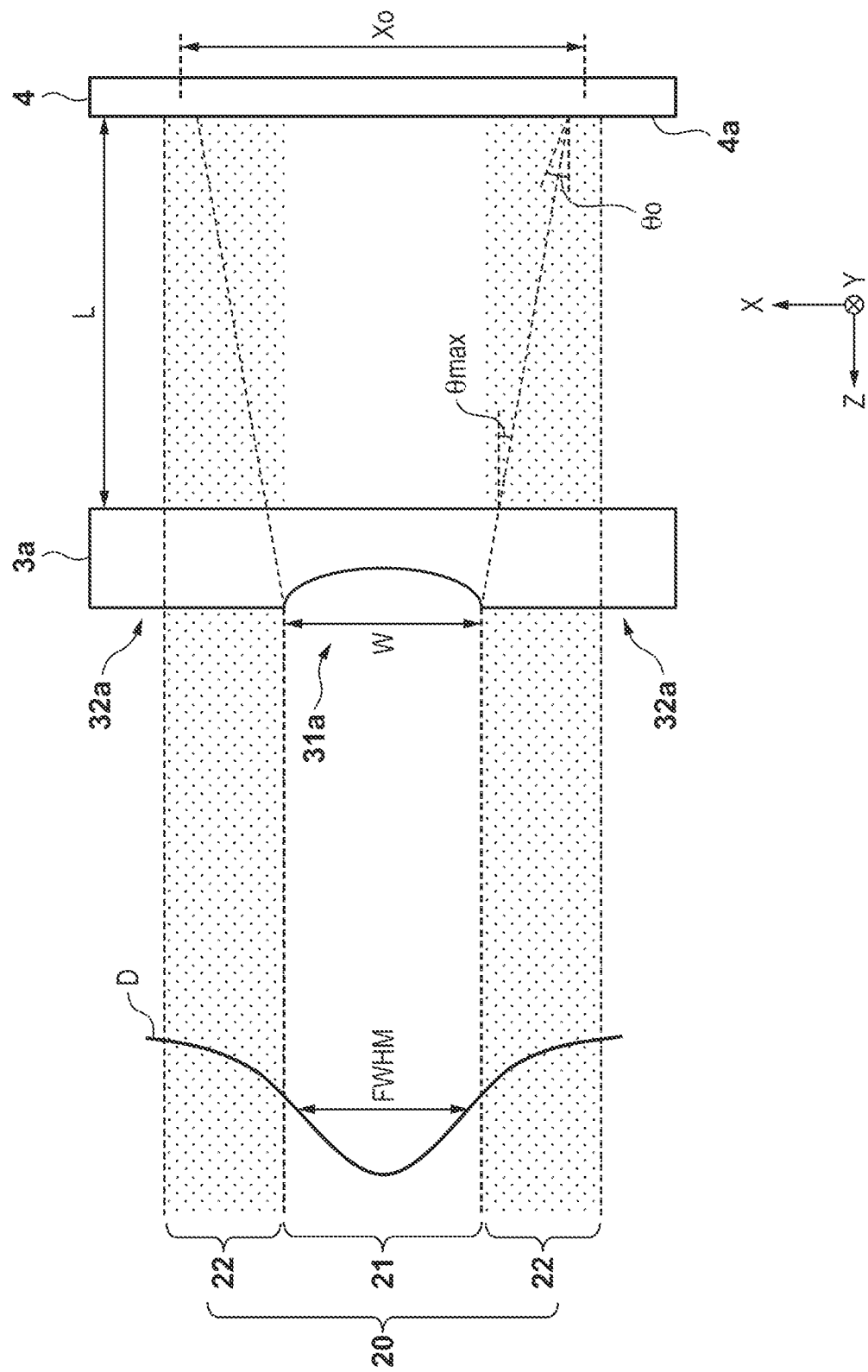
FIG. 3 is a view showing an optical path until the light beam from a light source is incident on a diffraction optical element via an optical lens.

FIGS. 2A and 2B are views showing the arrangement of an optical lens 3a according to Example 1. FIG. 2A is a perspective view, and FIG. 2B is a sectional view taken along a line A-A. In addition, FIG. 3 is a view showing an optical path from the light source 1 until the light beam is incident on the diffraction optical element 4 via the optical lens 3a. Light intensity distribution D in the X direction of the light beam from the light source 1 is also shown in FIG. 3.

As shown in FIGS. 2A and 2B, the optical lens 3a has a first region 31a through which a first light beam 21 near the center of the light beam 20 from the light source 1 is transmitted and a second region 32a through which a second light beam 22 (with lower light intensity than the first light beam 21) outside the first light beam 21 is transmitted. The first region 31a and the second region 32a have different curvatures, different refractive powers, and different refractive angles from each other. More specifically, in the first region 31a, the incident surface has a cylindrical shape and the exit surface has a planar shape so as to obtain a negative refractive power. On the other hand, in the second region 32a, the incident surface and the exit surface both have a planar shape. At this time, the maximum refractive angle of the first light beam 21 by the first region 31a can be made larger than the maximum refractive angle of the second light beam 22 by the second region 32a. Here, the shape of the border between the first region 31a and the second region 32a may be a differential continuous shape. The second region 32a may have a spherical shape so as to obtain a positive refractive power.

When the optical lens 3a that has been formed in this manner is used, as shown in FIG. 3, the first region 31a can expand the first light beam 21 in the X direction and cause it to be incident on the incident surface 4a of the diffraction optical element 4. On the other hand, the second region 32b causes the second light beam 22 to be incident on the incident surface 4a of the diffraction optical element 4 without expanding the second light beam in the X direction. As a result, a part of the first light beam 21 transmitted through the first region 31a and a part of the second light beam 22 transmitted through the second region 32a overlap in the X direction on the incident surface 4a of the diffraction optical element 4, and the light intensities of the light beams incident on the incident surface 4a can be uniformized. The maximum light intensity of the light beam incident on the incident surface 4a of the diffraction optical element 4 can be reduced, thereby reducing the local concentration of optical energy.

Figure 4:
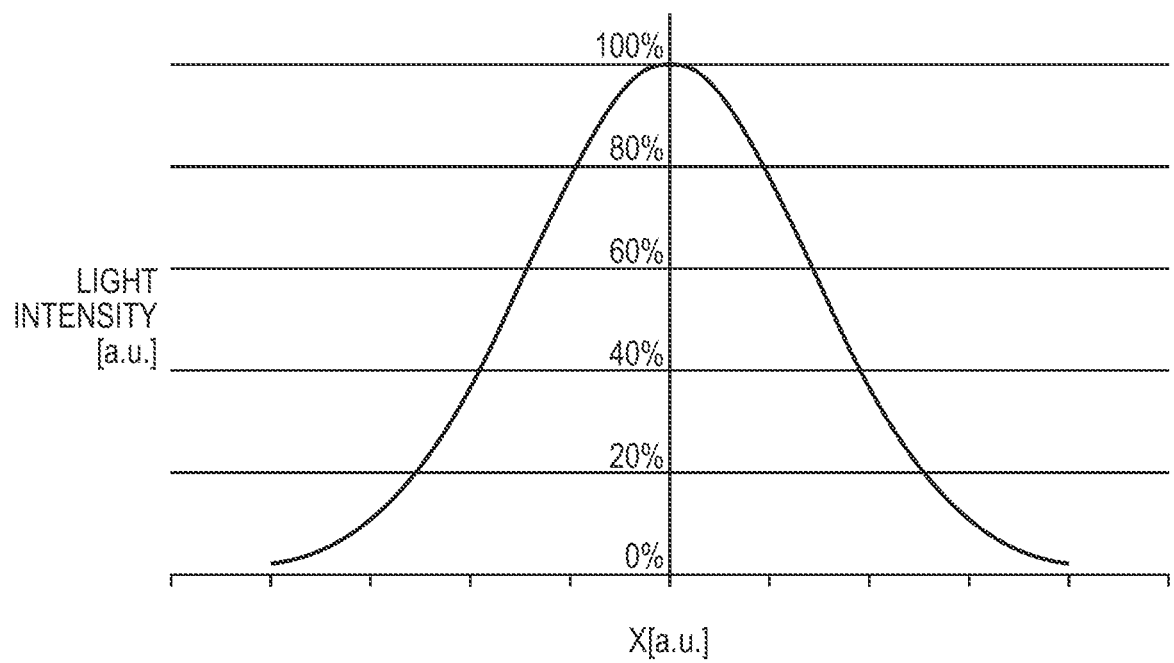
FIG. 4 shows the light intensity distribution that is formed on the incident surface of the diffraction optical element in a case in which the optical lens is not used.
Figure 5:
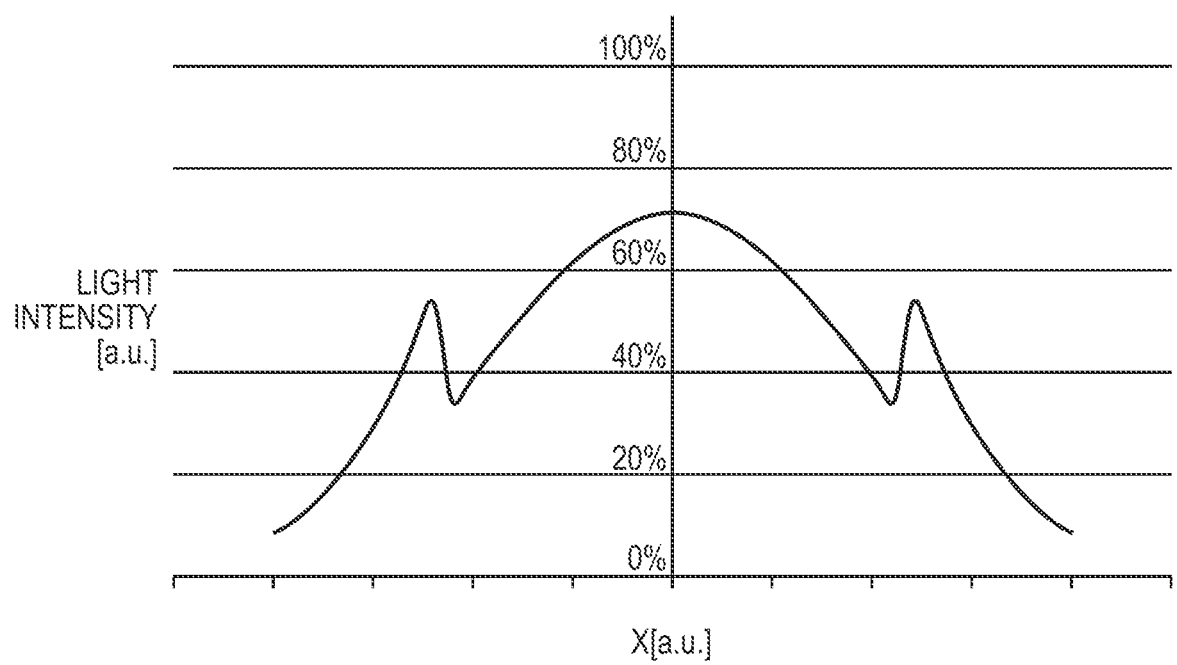
FIG. 5 shows the light intensity distribution that is formed on the incident surface of the diffraction optical element in a case in which the optical lens is used.

FIG. 4 shows the light intensity distribution formed on the incident surface 4a of the diffraction optical element 4 in a case in which the optical lens 3a is not used, and FIG. 5 shows the light intensity distribution formed on the incident surface 4a of the diffraction optical element 4 in a case in which the optical lens 3a is used. The ordinate in each of FIGS. 4 and 5 has been normalized by setting the maximum light intensity of the light intensity distribution formed on the incident surface 4a of the diffraction optical element 4 in a case (FIG. 4) in which the optical lens 3a is not used as 100%. It is obvious from FIGS. 4 and 5 that the light intensities (that is, the optical energy density) of the light beams incident on the incident surface 4a of the diffraction optical element 4 have been uniformized by the optical lens 3a.

Here, conditions preferable for arranging the optical lens 3a will be described with reference to FIG. 3. The following three conditions are preferable conditions to be applied when forming (manufacturing) the optical lens 3a. At least one of the conditions may be applied or none of the three conditions may be applied. In the following explanation, "W" represents the width (X direction) of the first region 31a, "L" represents the distance between the optical lens 3a and diffraction optical element 4. "$\theta_{max}$" represents the maximum exit angle in the X direction of the first light beam 21 emitted from the first region 31a (that is, the maximum incident angle of the first light beam 21 transmitted through the first region 31a and incident on the incident surface 4a of the diffraction optical element 4). "$X_0$" represents the effective diameter (the diameter of light to be used in the diffraction optical element 4) in the X direction of the diffraction optical element 4, and "$\theta_0$" represents the allowable angle (maximum allowable incident angle) in the X direction of the light incident on the diffraction optical element 4.

Condition 1

It is preferable to form the optical lens 3a so that the bus line of the first region 31a which has a cylindrical shape will intersect the optical axis of the light beam 20 from the light source 1 and be parallel to the Y direction. It is also preferable to form the optical lens 3a so that a light beam whose intensity is equal to or more than the half value of the maximum light intensity of the light beam 20 from the light source 1 is transmitted through the first region 31a. That is, the first light beam 21 is defined as a light beam whose intensity is equal to or more than the half value of the maximum light intensity of the light beam 20 from the light source 1. Furthermore, it is preferable to form the optical lens 3a so that the width W of the first region 31a is equal to or larger than a half-value width FWHM of the light intensity distribution D of the light beam 20 from the light source 1 as shown as $$\text{FWHM} \leq W \quad (1)$$

As a result, it is possible to prevent the light intensity (optical energy density) from becoming too high in a portion where the part of the first light beam 21 transmitted through the first region 31a and the part of the second light beam 22 transmitted through the second region 32a overlap on the incident surface 4a of the diffraction optical element 4. That is, it is possible to prevent the light intensity of the overlapping portion from reaching the maximum light intensity on the incident surface 4a of the diffraction optical element 4 (the light intensity of the overlapping portion can be made lower than the maximum light intensity on the incident surface 4a of the diffraction optical element 4).

Condition 2

It is preferable for the optical lens 3a to be formed so that the width (the incident range width, also referred to as the diameter) of the first light beam 21, which is transmitted through the first region 31a and is incident on the incident surface 4a of the diffraction optical element 4, is equal to or less than the width (to be also referred to as the effective diameter $X_0$ hereinafter) of the region of the diffraction optical element 4 through which the light beam is passed through as shown as $$2 \times (L \times \theta_{max}) + W \leq X_0 \quad (2)$$

The optical lens 3a is formed so that the diameter of the second light beam 22 which is incident on the incident surface 4a of the diffraction optical element 4 will be larger than the effective diameter $X_0$ of the diffraction optical element 4. In this case, the diameter of the first light beam 21, which is transmitted through the first region 31a and is incident on the incident surface 4a of the diffraction optical element 4, can become smaller than the width of the second light beam 22, which is transmitted through the second region 32a and is incident on incident surface 4a of the diffraction optical element 4. As a result, among the light beams transmitted through the optical lens 3a and are incident on the incident surface 4a of the diffraction optical element 4, it is possible to reduce a light beam which does not fall within the effective diameter $X_0$ of the diffraction optical element 4, that is, a light beam which will become a loss by being unused by the diffraction optical element 4.

Condition 3

It is preferable for the optical lens 3a to be formed so that the maximum exit angle $\theta_{max}$ in the X direction of the first light beam 21 which is transmitted and emitted through the first region 31a will be equal to or less than the allowable angle $\theta_{max}$ in the X direction of incident light on the diffraction optical element 4 as shown as $$\theta_{max} \leq \theta_0 \quad (3)$$

As a result, in the same manner as the condition 2, it is possible to reduce, among the light beams transmitted through the optical lens 3a and are incident on the incident surface 4a of the diffraction optical element 4, a light beam which does not fall within the effective diameter $X_0$ of the diffraction optical element 4 and becomes a loss.

By arranging the optical lens 3a, which has been formed in this manner, between the light source 1 (relay optical system 2) and the diffraction optical element 4, it is possible to uniformize the light intensity distribution of the light beam from the light source 1 and guide the light beam to the diffraction optical element 4. That is, it can prevent the optical energy from concentrating locally on the optical member (for example, the diffraction optical element 4) of the illumination optical system IL and reduce the local degradation of the glass material performance Although the light intensity on the incident surface 4a of the diffraction optical element 4 has been noted and described in this embodiment, for example, the plane conjugate to the incident surface 4a of the diffraction optical element 4 can be described in the same manner A conjugate surface 9 of the incident surface 4a of the diffraction optical element 4 is present on the optical path of the zoom lens unit 8, and the presence of the optical lens 3a can prevent local concentration of optical energy in each of the plurality of single lenses arranged near the conjugate surface.

Example 2

Figure 6A:
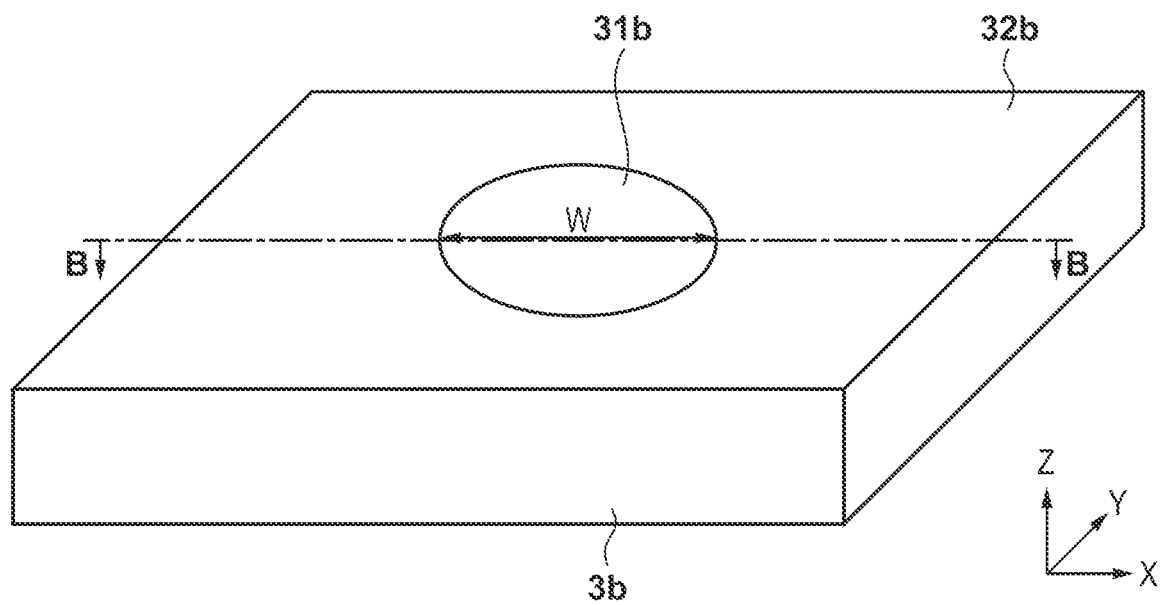
FIG. 6A is a view showing the arrangement of an optical lens according to Example 2.
Figure 6B:
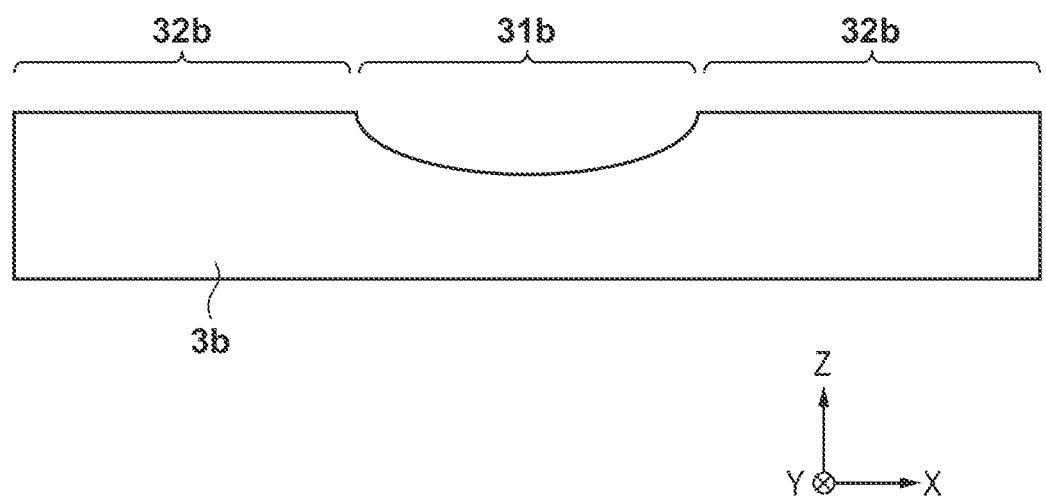
FIG. 6B is a view showing the arrangement of the optical lens according to Example 2.

Example 1 described a case in which the optical lens 3a used when the light intensity distribution D of the light beam from the light source 1 is generated in at least one direction (X direction). Example 2 will describe an optical lens 3b used in a case in which the light intensity distribution of the light beam from the light source 1 has been generated in each of the planar directions (the X and Y directions in FIG. 1) perpendicular to the optical axis, that is, not only in the X direction but also in the Y direction. FIGS. 6A and 6B are views showing the arrangement of the optical lens 3b according to Example 2. FIG. 6A is a perspective view, and FIG. 6B is a sectional view taken along a line B-B.

The optical lens 3b includes, as shown in FIGS. 6A and 6B, a first region 31b through which the first light beam 21 near the center of the light beam from the light source 1 is transmitted and a second region 32b through which the second light beam 22 (which has lower light intensity than the first light beam 21) outside the first light beam 21 is transmitted. The incident surface of the first region 31b has a spherical shape and the exit surface of the first region 31b has a planar shape so as to obtain a negative refractive power. On the other hand, the incident surface and the exit surface of the second region 32b both have a planar shape. Here, each of the conditions 1 to 3 described above in Example 1 may be suitably applied when arranging the optical lens 3b. At this time, not only each of the conditions 1 to 3 may be applied to the X direction but may be also applied to the Y direction. The second region 32b may have a spherical shape so as to obtain a positive refractive power.

In the optical lens 3b formed in this manner, the first light beam 21 that has been transmitted through the first region 31b can be expanded in not only the X direction but also in the Y direction and be incident on the incident surface 4a of the diffraction optical element 4. As a result, it is possible to cause a part of the first light beam 21 transmitted through the first region 31b and a part of the second light beam 22 transmitted through the second region 32b to overlap each other in the XY direction and uniformize the light intensities of the light beams incident on the diffraction optical element 4 so that local concentration of optical energy can be reduced.

Example 3

Figure 7:
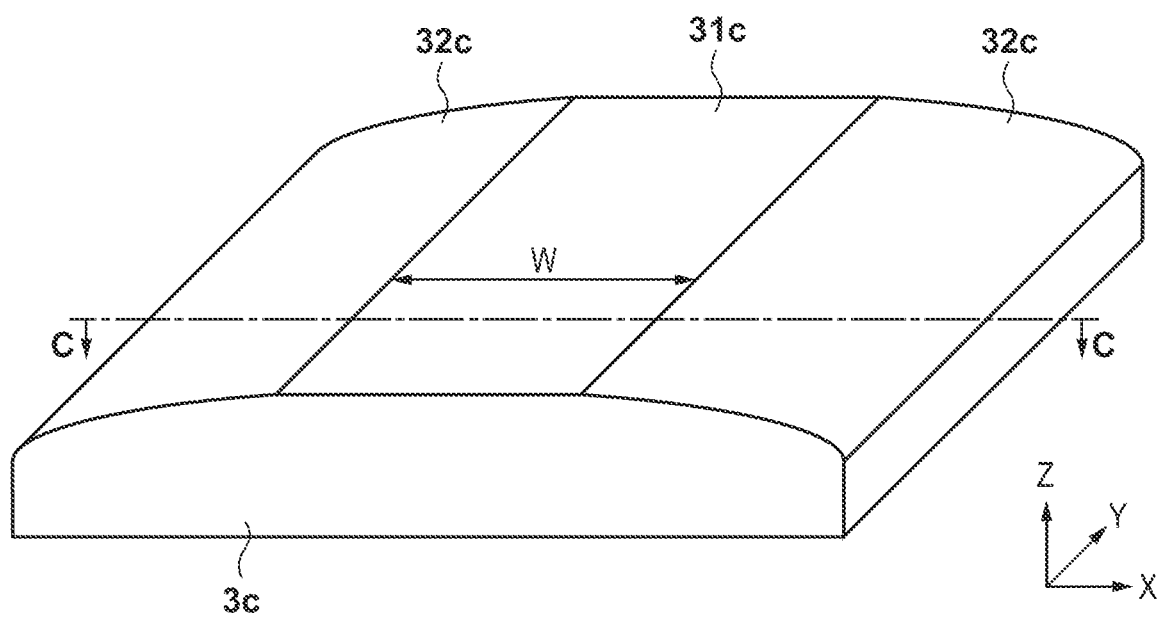
FIG. 7 is a view showing the arrangement of an optical lens according to Example 3.

Example 3 will describe another example of the arrangement of the optical lens 3 that uniformizes the light intensity distribution of the light beam 20 from the light source 1. FIG. 7 is a perspective view showing the arrangement of an optical lens 3c according to Example 3. FIG. 8 is a view showing the optical path until the light beam 20 from the light source 1 is incident on the diffraction optical element 4 via the optical lens 3c. The optical lens 3c according to Example 3 can be used in a case in which the light intensity distribution is generated in at least one (X direction) of the planar directions perpendicular to the optical axis in the light beam from the light source 1, and in which a convex lens that has a positive refractive power is arranged in front of the diffraction optical element 4. In a case in which the light intensity distribution is generated in not only the X direction but also in the Y direction of the optical axis from the light source 1, the following arrangement can be applied also to the Y direction in the same manner as in Example 2.

The optical lens 3c is used as a substitute of the convex lens. The optical lens 3c includes, as shown in FIG. 7, a first region 31c through which the first light beam 21 near the center of the light beam 20 from the light source 1 is transmitted and a second region 32c through which the second light beam 22 (which has lower light intensity than the first light beam 21) outside the first light beam 21 is transmitted. The incident surface and the exit surface of the first region 31c both have a planar shape. On the other hand, the incident surface and the exit surface of the second region 32c have a spherical shape and a planar shape, respectively, so as to obtain a positive refractive power. The first region 31c may have a spherical shape so as to obtain a negative refractive power.

When the optical lens 3c that is formed in this manner is used, a part of the first light beam 21 transmitted through the first region 31c and a part of the second light beam 22 transmitted through the second region 32c overlap each other on the incident surface 4a of the diffraction optical element 4, as shown in FIG. 8. As a result, compared to a case that uses the convex lens, it is possible to uniformize the light intensity distribution of the light beam incident on the diffraction optical element 4 and reduce the local concentration of the optical energy.

Embodiment of Method of Manufacturing Article

A method of manufacturing an article according to the embodiment of the present invention is suitable for manufacturing an article such as a microdevice (for example, a semiconductor device) or an element having a microstructure. The method of manufacturing an article according to the embodiment includes a step of forming, by using the above-described exposure apparatus, a latent image pattern on a photoresist applied to a substrate (a step of exposing a substrate), and a step of developing (processing) the substrate on which the latent image pattern has been formed in the preceding step. Further, this manufacturing method includes other well-known steps (for example, oxidization, deposition, vapor deposition, doping, planarization, etching, resist removal, dicing, bonding, and packaging). The method of manufacturing an article according to the embodiment is superior to a conventional method in at least one of the performance, quality, productivity, and production cost of the article.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-174244 filed on Sep. 11, 2017, which is hereby incorporated by reference herein in its entirety.

What is claimed is:

1. An illumination optical system that illuminates a surface to be illuminated by using a light beam from a light source, comprising:
 a lens configured to transmit the light beam from the light source; and
 a diffraction optical element that has an incident surface on which the light beam transmitted through the lens is incident,
 wherein the lens is formed such that a part of a light beam transmitted through a first region of the lens and at least a part of a light beam transmitted through a second region of the lens overlap each other on the incident surface of the diffraction optical element, the first region including a central portion of the lens, and the second region being different from the first region, and
 wherein the lens includes a first surface and a second surface opposite to the first surface, the first surface and the second surface being configured to transmit a light beam, and a curvature of the first region in the first surface and a curvature of the second region in the first surface are different from each other.

2. The system according to claim 1, wherein the lens is formed so as to overlap the part of the light beam which is transmitted through the first region and the part of the light beam which is transmitted through the second region, on the incident surface of the diffraction optical element, in only one direction perpendicular to the optical axis of the light beam.

3. The system according to claim 1, wherein an incident surface or an exit surface of the first region in the first surface has a cylindrical shape.

4. The system according to claim 1, wherein an incident surface or an exit surface of the first region in the first surface has a spherical shape.

5. The system according to claim 1, wherein the second region in the first surface has a planar shape.

6. The system according to claim 1, wherein the lens is formed so that a width of the light beam which is transmitted through the first region and is incident on the incident surface of the diffraction optical element is smaller than a width of the light beam which is transmitted through the second region and is incident on the incident surface of the diffraction optical element.

7. The system according to claim 1, wherein the lens is formed so that a width of the light beam which is transmitted through the first region and is incident on the incident surface of the diffraction optical element is smaller than a width of a region through which the diffraction optical element allows the light beam to pass.

8. The system according to claim 1, wherein the lens is formed so that a light beam which has an intensity not less than a half of the maximum light intensity of the light beam from the light source is transmitted through the first region.

9. The system according to claim 1, wherein the lens is formed so that the maximum incident angle of the light beam transmitted through the first region and incident on the incident surface of the diffraction optical element is smaller than the maximum allowable incident angle of the diffraction optical element.

10. The system according to claim 1, wherein the lens is formed so that a shape of a border between the first region and the second region is a curved line or a straight line.

11. The system according to claim 1, wherein the light source is a laser light source.

12. The system according to claim 1, further comprising an optical system arranged between the light source and the lens,
   wherein a parallel light beam transmitted through the optical system is incident on the lens.

13. An exposure apparatus which exposes a substrate, comprising:
   an illumination optical system configured to illuminate an original by using a light beam from a light source; and
   a projection optical system configured to project, onto the substrate, a pattern of the original illuminated by the illumination optical system,
   wherein the illumination optical system includes:
   a lens configured to transmit the light beam from the light source; and
   a diffraction optical element that has an incident surface on which the light beam transmitted through the lens is incident,
   wherein the lens is formed such that a part of a light beam transmitted through a first region of the lens and at least a part of a light beam transmitted through a second region of the lens overlap each other on the incident surface of the diffraction optical element, the first region including a central portion of the lens, and the second region being different from the first region, and
   wherein the lens includes a first surface and a second surface opposite to the first surface, the first surface and the second surface being configured to transmit a light beam, and a curvature of the first region in the first surface and a curvature of the second region in the first surface are different from each other.

14. A method of manufacturing an article, the method comprising:
   exposing a substrate using an exposure apparatus;
   developing the exposed substrate; and
   processing the developed substrate to manufacture the article,
   wherein the exposure apparatus exposes a substrate, and includes:
   an illumination optical system configured to illuminate an original by using a light beam from a light source; and
   a projection optical system configured to project, onto the substrate, a pattern of the original illuminated by the illumination optical system,
   wherein the illumination optical system includes:
   a lens configured to transmit the light beam from the light source; and
   a diffraction optical element that has an incident surface on which the light beam transmitted through the lens is incident,
   wherein the lens is formed such that a part of a light beam transmitted through a first region of the lens and at least a part of a light beam transmitted through a second region of the lens overlap each other on the incident surface of the diffraction optical element, the first region including a central portion of the lens, and the second region being different from the first region, and
   wherein the lens includes a first surface and a second surface opposite to the first surface, the first surface and the second surface being configured to transmit a light beam, and a curvature of the first region in the first surface and a curvature of the second region in the first surface are different from each other.

15. The system according to claim 5, wherein the second region in the second surface has a planer shape.

16. The system according to claim 1, wherein the first surface is one of an incident surface and an exit surface of the lens, and the second surface is the other of the incident surface and the exit surface of the lens.

17. The system according to claim 1, further comprising an optical integrator configured to form a plurality of secondary light sources, and
   wherein the lens and the diffraction optical element are arranged between the light source and the optical integrator.

18. The system according to claim 17, wherein the optical integrator includes a fly-eye lens.

* * * * *